United States Patent [19]

Kosmowski et al.

[11] Patent Number: 5,529,441
[45] Date of Patent: Jun. 25, 1996

[54] DRILL COORDINATE OPTIMIZATION FOR MULTI-LAYER PRINTED CIRCUIT BOARD

[75] Inventors: Wojciech B. Kosmowski, San Juan Capistrano; John M. Rudolph, Carlsbad, both of Calif.

[73] Assignee: Cybernetics Products, Inc., Santa Ana, Calif.

[21] Appl. No.: 431,618

[22] Filed: May 1, 1995

Related U.S. Application Data

[63] Continuation of Ser. No. 203,552, Feb. 28, 1994, abandoned.
[51] Int. Cl.$^6$ .............................. B23B 35/00; B23B 41/00
[52] U.S. Cl. .................... 408/1 R; 364/474.02; 364/474.15; 408/2; 408/13; 408/16
[58] Field of Search ................................ 408/1 R, 2, 3, 408/7, 13, 16; 364/474.02, 474.15, 474.35

[56] References Cited

U.S. PATENT DOCUMENTS

| | | | |
|---|---|---|---|
| 4,708,545 | 11/1987 | Fujii et al. | 408/1 R |
| 4,790,694 | 12/1988 | Wilent et al. | 408/1 R |
| 5,111,406 | 5/1992 | Zachman et al. | 408/16 |
| 5,347,462 | 9/1994 | Okuda et al. | 408/16 |

FOREIGN PATENT DOCUMENTS

| | | | |
|---|---|---|---|
| 172610 | 7/1990 | Japan | 408/16 |
| 75807 | 3/1992 | Japan | 408/3 |

OTHER PUBLICATIONS

"Multilayer Measuring/Drilling Machine MLV 92," Wessel GmbH, Germany.
Proposal for Feature Measurement Drilling machine, Dynamotion Corporation, 1991.
"CNC–Precision Drilling and Routing Machine LBA 805," Wessel GmbH, Germany.

Primary Examiner—Daniel W. Howell
Attorney, Agent, or Firm—Roberts and Quiogue

[57] ABSTRACT

A system and method for optimizing drill coordinates in a multi-layer printed circuit board, to correct for interlayer shift during lamination. A set of test patterns, in the form of a cross formed by two orthogonal conductor lines, are defined at each corner of each layer in the same nominal location. Under ideal conditions, the test patterns of the layers in each corner are lined up one above the other, without any offset. A counter sinking tool is used to cut a conical bore in the location of the test patterns, so that every test pattern cross is interrupted in four places, generating a four segment pattern in each layer. A high resolution camera is placed above the countersunk bore to form a single image of the exposed segment edges of all the test patterns exposed by the bore. The image is analyzed to determine the amount of shift of each layer. If all patterns are perfectly concentric, all crosses are perfectly aligned. By measuring the shift of each pattern from the nominal position, the amount of shift in each layer is determined. The process is repeated for the test patterns at each corner of the board, and the resultant layer shift data is processed to optimize the drilling pattern for the board.

35 Claims, 10 Drawing Sheets

DRILL COORDINATE OPTIMIZATION FOR MULTI-LAYER PRINTED CIRCUIT BOARD

This is a continuation of application Ser. No. 08/203,552 filed on Feb. 28, 1994, now abandoned.

TECHNICAL FIELD

This invention relates to the drilling of holes in multi-layer printed circuit boards (PCBs), and more particularly, to a technique for optimizing the drilled hole patterns to compensate for lamination drift in the various layers of the PCB.

BACKGROUND OF THE INVENTION

As the speed and complexity of electronic products increases, so do the challenges of manufacturing these products. The shrinking feature sizes of high-tech electronics are necessary to achieve the high clock speeds of digital electronics. This miniaturization is often achieved by adding more inner layers to PCBs and reducing the size of the circuit features. Miniaturization requires all manufacturing process tolerances to be reduced.

Originally, plated through holes in multilayers performed two functions, to interconnect layers, and to provide mounting for components. Surface mounted technology eliminated the need for the component mounting function. Therefore, the only purpose of the plated through hole is to interconnect the layers of the multilayer board.

The requirement for high speed circuitry dictates high density of conductors with, consequently, smaller traces and pads are designed. Printed circuit material is inherently unstable, therefore, small features drift during lamination. Laminating drift is getting bigger in proportion to the feature of the circuit board. For example, 0.002" drift in lamination represents a small percentage of a 0.030" diameter pad. However, the same 0.002" drift is very significant for a 0.010" pad. In addition, the annular ring of a 0.030" diameter pad with a 0.018" diameter hole will be 0.006" in contrast to a 0.010" pad with a 0.006" diameter hole which will be 0.002". This condition does not require absolute positioning accuracy since the components are not mounted through the hole. Instead, uniform drift of all the layers during lamination is necessary to line up all layers of the circuitry. The remaining task is to find the pad and determine the actual drift and drill the hole through it without breaking out of the annular ring.

Producing high density multilayer boards involves a lamination process. During the lamination process heat and pressure are applied to the stack of layers in order to bind it together. During this process, dimensional changes occur in the position of the circuitry in each layer. In most cases, special test coupons with fiduciary marks are designed into the boards in order to determine the amount of image shift during the lamination process. By comparing nominal locations with actual locations of the fiduciary marks, the amount of shift can be determined. The shifts of all points can be analyzed by computer to determine average correction in X, Y and theta axes to optimize the pattern and determine the best fit between the theoretical axes and the actual axes of the board.

The continually decreasing size of high density multilayer features applies more demands from registration accuracy. Hard tooling methods are no longer adequate for the accuracies required to ensure proper registration between circuitry details and drilled holes, or registration edges of the high density multilayers. External X-ray methods of determining shift are time consuming and not very accurate. Such methods typically employ an independent X-ray system, located apart from the drilling machine, which require removing the board from the drilling machine and do not provide adequate resolution. Also, correction numbers had to be fed into the controller of the drilling machine manually. This method is slow and not accurate enough. In addition, it requires transfer of the board from the drilling machine which introduces tooling errors to the process.

The object of the invention is to provide a practical means of determining lamination drift in the multilayers and apply appropriate corrections to obtain the best fit between the actual and theoretical pattern before drilling without removing the board from the drilling machine.

SUMMARY OF THE INVENTION

A method is described for optimizing drill coordinates in a laminated multilayer printer circuit board, to compensate for layer-to-layer shifts from nominal alignments. The method includes the following steps:

forming one or more test patterns in at least two of the layers prior to lamination, arranged at one or more predetermined nominal test pattern locations in layers, so that a test pattern in at least one layer nominally overlays a test pattern in another layer under nominal board assembly conditions;

forming an opening in an exposed surface of the laminated circuit board at each of the test pattern locations, having a depth sufficient to penetrate each layer having the test patterns formed therein and having a cross-sectional dimension which decreases in size from a dimension at the board surface to a smaller dimension, thereby exposing edges of the test patterns in sidewalls of the openings;

forming from above the surface a single image of each opening, each image comprising pixels representing the exposed edges of the test patterns;

processing the images to determine from the exposed test pattern edges deviations from nominal positions of the test patterns of the layers; and using the deviations to optimize drill coordinates to compensate for the deviations.

In a preferred embodiment, the openings are tapered and formed by a counter-sink tool.

In accordance with another aspect of the invention, an automated drilling system is described. The system includes a work table having means for registering a mounted position of a workpiece, and a drilling spindle having a spindle axis mounted orthogonally to the work table. An optical image means is included for capturing digitized optical images of an area of the workpiece mounted on the work table, from an image position generally orthogonal to the work table and spaced from a surface of the workpiece. A precision positioning means effects relative movement between the work table and the spindle and between the work table and the image position in a plane orthogonal to a spindle axis.

A nominal drill pattern program specifies nominal drill size and coordinates of a drill pattern to be drilled into the board. The system further includes a drill coordinate optimization means for compensating the nominal drill coordinates for inter-layer shifts of layers comprising the board from nominal positions. The optimizing means comprising means for cutting an opening into the board at the nominal test pattern locations, the opening having an opening depth and cross-sectional dimension which decreases from the board surface to the depth so as to expose portions of the test patterns in said various layers to view from above the surface.

The optimizing means further includes means for operating the positioning system for each test pattern location to position the opening relative to the image position so that an optical image of the opening is visible from the image location, and means for operating the image means to capture a single image of the opening and the visible portions of the test patterns. A processor processes the images to determine deviations from nominal layer locations of the respective layers and to calculate compensation values, and modifies the nominal hole coordinates by the compensation values. The system control then operates the positioning means and drilling spindle to drill the board in accordance with compensated hole coordinates.

BRIEF DESCRIPTION OF THE DRAWING

These and other features and advantages of the present invention will become more apparent from the following detailed description of an exemplary embodiment thereof, as illustrated in the accompanying drawings, in which.

DETAILED DESCRIPTION OF THE PREFERRED EMBODIMENT

This invention determines corrections to be applied to a printed circuit drill program to optimize the drilled hole patterns with respect to the distorted layers. An optimization means mathematically determines the compensation values (X-offset, Y-offset, X-stretch, Y-stretch, and rotation) such that circular annular rings on selected layers will exhibit no break-out when a hole is drilled. "Break-out" refers to the portion of a drilled hole area which extends outside the pad circumference. This technique will also inspect the lamination registration and prevent drilling an excessively distorted panel unable to meet the final design goals. This method demonstrates advantages over conventional techniques in speed, accuracy, target area, and simplicity.

Figure 1:
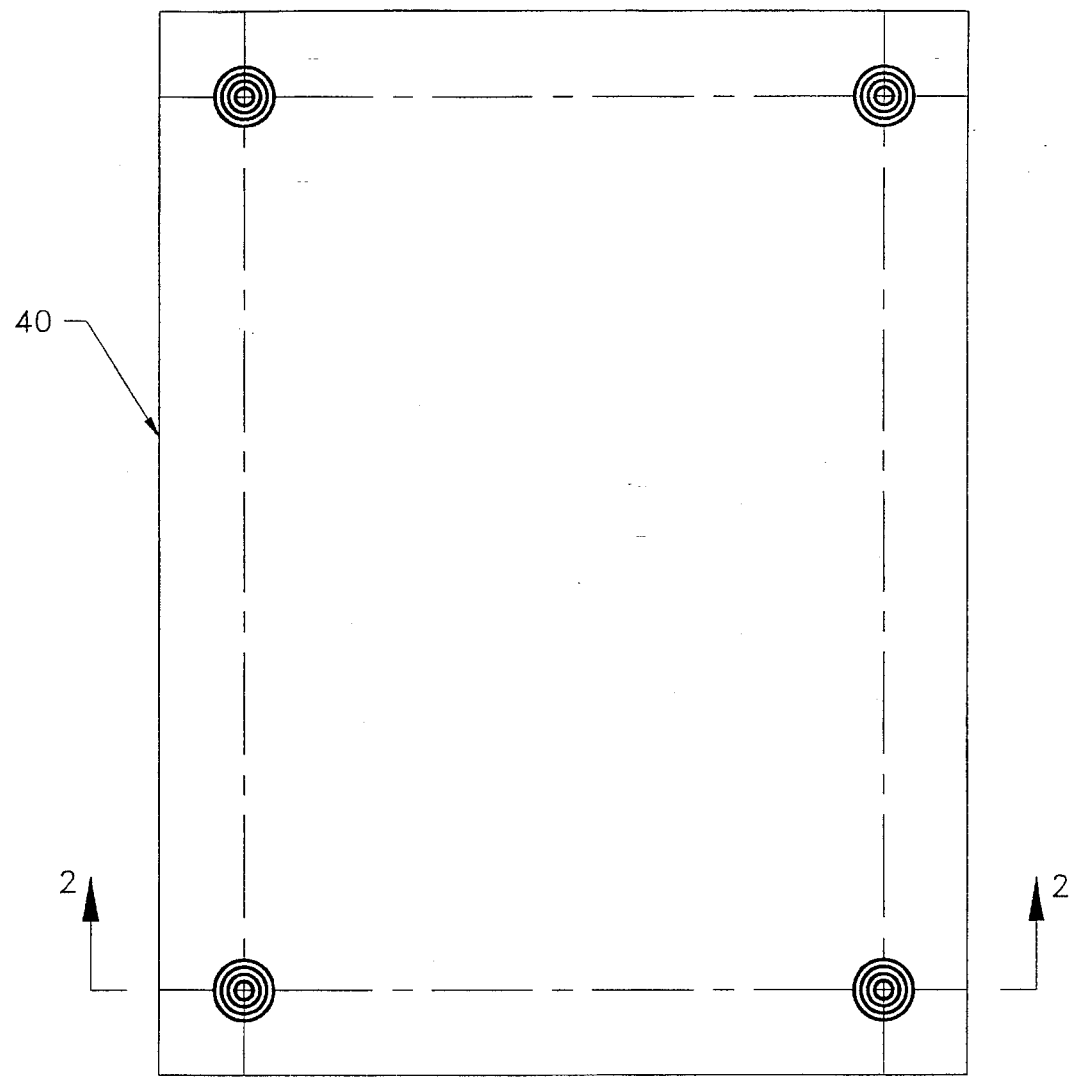
FIG. 1 is a top view of an exemplary multilayer PCB having a plurality of test patterns defined in each layer in accordance with an embodiment of this invention.
Figure 2:
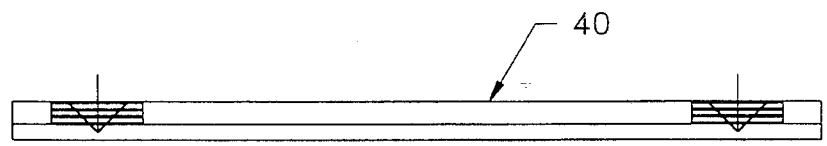
FIG. 2 is a cross-sectional view taken along line 2—2 of FIG. 1.
Figure 3:
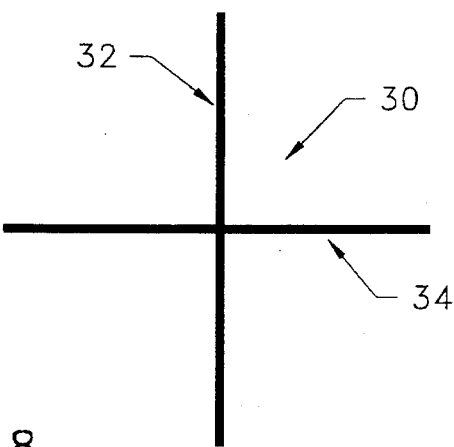
FIG. 3 illustrates an exemplary test pattern in accordance with an embodiment of the invention.

FIG. 1 is a top view of an exemplary multilayer, laminated PCB 40. In a preferred embodiment of the invention, a target cross pattern 30 comprising two orthogonal 5 to 10 mil lines 32 and 34 is added to each of the four corners of each layer artwork for the PCB 40. An exemplary pattern is shown in FIG. 3. Each cross pattern is located precisely at the same nominal coordinate position on each layer, and the nominal coordinates of all target patterns are known. Each layer typically includes a surface layer of conductive material such as copper on a dielectric substrate. The conductive layer is selectively etched away to form the target, by use of conventional board fabrication techniques. The patterns 30 can be placed in a 0.125 inch circular ring with no lines extending beyond the ring. The ring is optional, but demonstrates the small footprint required for use of this technique. The various layers are then laminated together in the convention manner to form the multilayer PCB. It is during this lamination process that displacements of the various layers from the nominal aligned positions occur, as a result of the heat and pressure applied. This invention is to compensate for such unwanted displacements.

The next stage in the fabrication process of a finished board is to drill the many holes used typically for interconnections between points on the layers.

Figure 4:
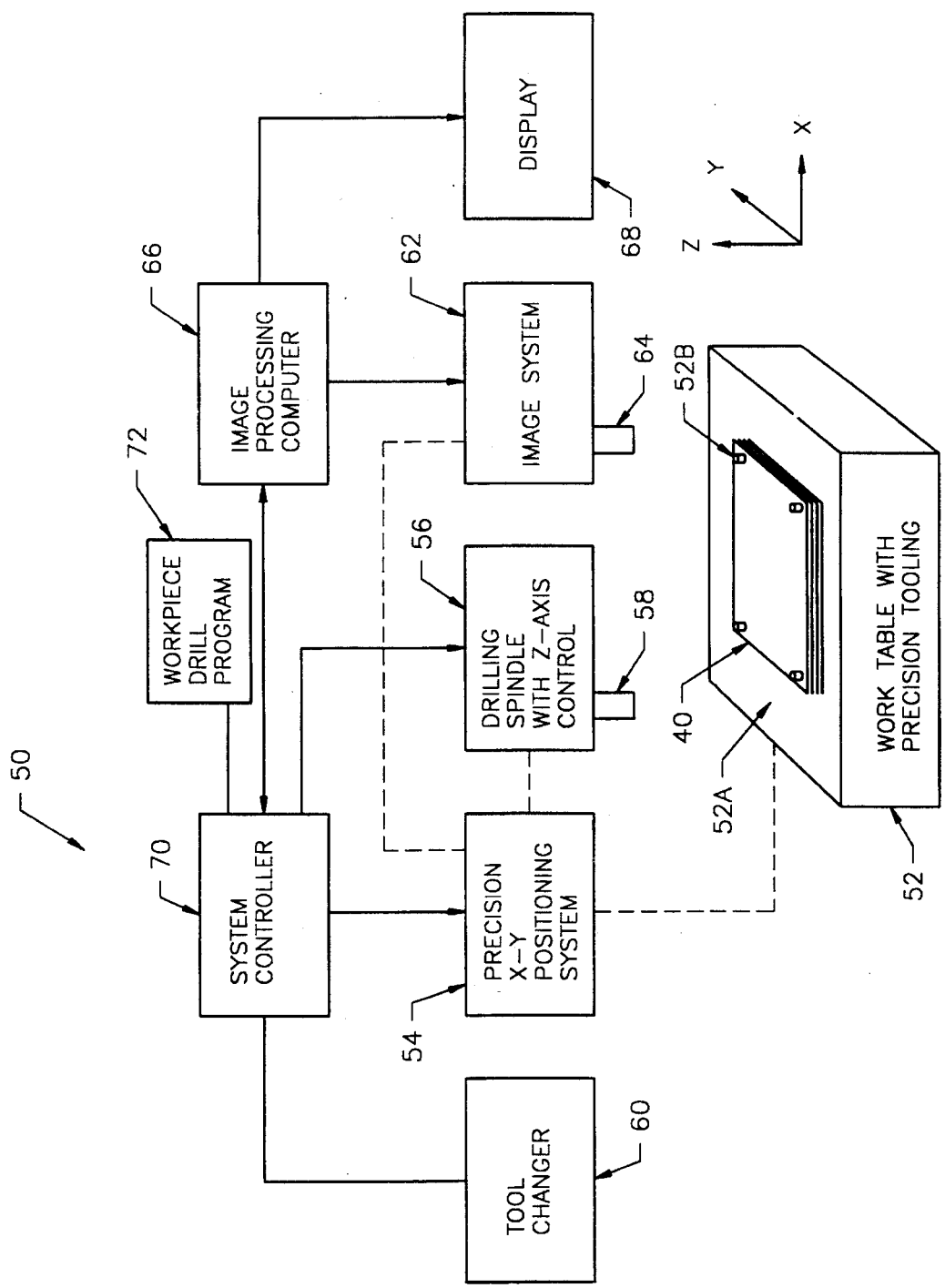
FIG. 4 is a schematic block diagram of an embodiment of a drilling system in accordance with the invention.

The multilayer printed circuit board 40 with the cross target 30 defined in each layer is affixed to the tooling plate 52A of a drilling system 50, as shown in FIG. 4, equipped with a computer vision system comprising a camera image system 62 employing a telecentric lens 64 and an image processing computer 66. The system 50 is controlled by a system controller 70, and includes a work table 52 on which the tooling plate 52A is mounted. A precision X-Y positioning system 54 precisely positions the work table 52 in relation to a drilling spindle 56 which drives a drilling tool 58, and relative to the image system 62 and lens 64. In an exemplary embodiment, the X-Y positioning system 54 moves the table 52 along the Y axis, and moves the spindle and lens along the X axis, to position the workpiece 40 relative to the spindle and lens, which are mounted on a movable carriage which can be driven along the X axis and is attached to an overhead beam also extending along the X axis. The spindle moves the drilling tool in the Z axis to perform drilling sequences. Such split-axis positioning systems are well known in the art. Alternatively, an X-Y positioning system as described in U.S. Pat. No. 4,761,876 could also be employed.

The drilling system 50 further includes a tool changer 60 for dispensing different tools used in operation of the system. A suitable tool changer and method of operation is described, for example, in U.S. Pat. No. 5,068,958.

Figure 5:
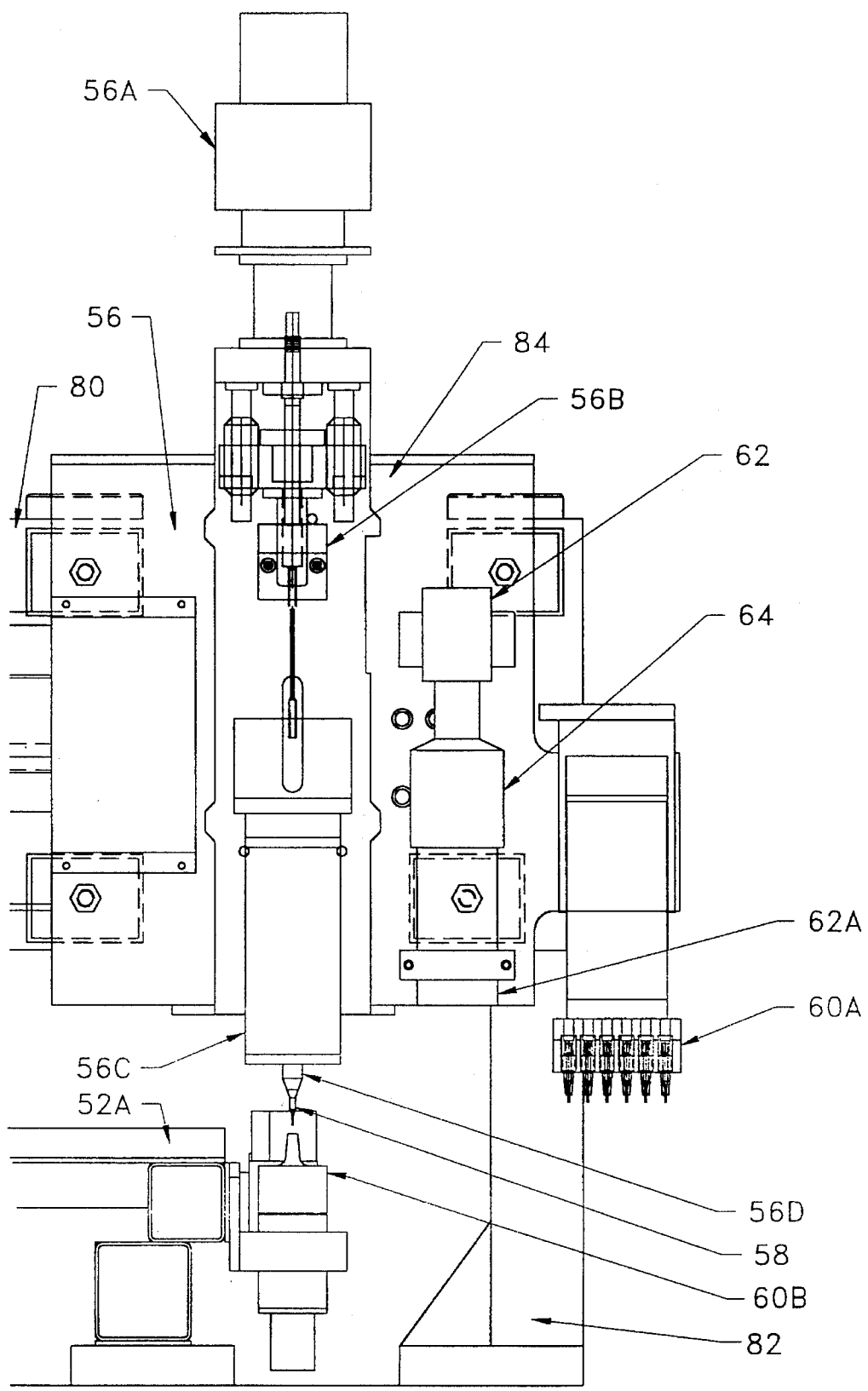
FIG. 5 is a front view of a portion of the drilling system of FIG. 4.

FIG. 5 illustrates a exemplary arrangement of elements of the drilling system 50 in further detail. The spindle 56 includes a Z-axis motor 56A, a housing 56B and a rotational spindle drive motor 56C including a rotor to which is secured a tool chuck 56D, which secures the tool 58. The spindle housing 56B is secured to a carriage 84 arranged for translation along a horizontal support beam 80 fixed in position above the work table 52 by vertical beams 82. The camera 62 is also secured to the carriage 84, and moves along the X axis with the spindle. The camera 62 in a preferred form includes a CCD array for forming a digitized image of the scene viewed through the gaging lens 64. Cameras suitable for the purpose are commercially available, for example the TM-7CN miniature high resolution CCD camera marketed by PULNix America Inc., 770 Lucerne Drive, Sunnyvale, Calif. 94806. The computer vision system further includes an LED light ring 60A comprising a ring of LEDs disposed around the periphery of the lens 64 to provide illumination of the conical bores formed in the PCB 40. The use of a red illumination source has been found to work well in providing detailed images of the PCB. The tool changer 60 includes a tool magazine 60A mounted on the carriage 84, and a tool changer gripper 60B mounted at a side of the work table 52.

The nominal coordinates and hole sizes for the particular workpiece 40 are defined by a workpiece drill program 72. The drill coordinates and program specifications will of course be customized for each type of workpiece. The drill program can be accessed by the system controller 70, e.g., through a disk drive or other conventional data input device.

Accuracy is improved when using the drilling system 50 to measure and drill the printed circuit board without removing it from the tooling pins 52B. Simply removing the board from the tooling pins and replacing it can, in a typical drilling system, account for 0.0004 inches of position offset. This error can in a typical application use one-third of the total tolerance budget.

To optimize the drill coordinates to the particular printed circuit board 40, the drilling system 50 is then operated under computer control to cut a cone-shaped opening in the PCB at each corner target area, exposing edges of the 5 to 10 mil lines of each layer. The opening may be cut, for example, by use of a conventional counter-sink tool 45 having a tip defining an included angle of about 100 degrees, although other angles will also provide satisfactory vision of the layers.

Figure 11:
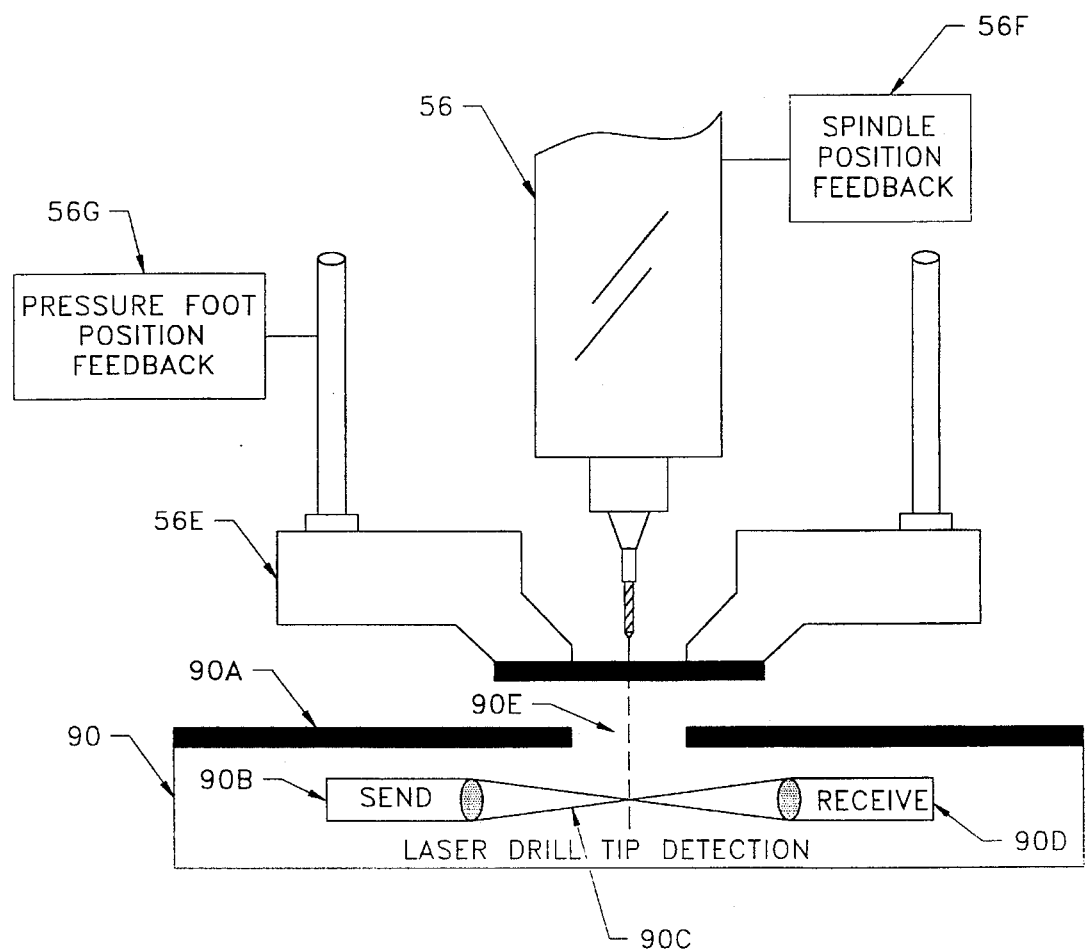
FIG. 11 illustrates a calibration station for calibrating the relationship of the cutting tool tip to the spindle pressure foot, to enable precise control of the depth of a drill stroke.

The drilling system 50 precisely controls the depth of the cutting operation forming the opening region 42. To ensure precise depth control, the position of the cutting tool tip in relation to the spindle pressure foot is calibrated each time the cutting tool is picked from the tool changer. One exemplary technique for this calibration is illustrated in FIG. 11. The system 50 includes a calibration station 90 mounted to the side of the work table 52 beside the tool changer gripper 60B. The station includes a surface 90A and an optical sensor comprising a semiconductor laser 90B for generating a sensor beam 90C a precisely known distance below the surface 90A and a photodetector tuned to the laser wavelength for detecting the beam. An opening 90E is formed in the surface 90A. The spindle with the cutting tool in the spindle chuck is moved over the calibration surface opening 90E, as shown in FIG. 11, and the Z-axis drive of the spindle is activated to gently lower the tool to the calibration station. As the tool is lowered, the pressure foot contacts the surface 90A, resulting in relative movement between the pressure foot and spindle body in the conventional manner. Position sensors 56F and 56G keep track of movement of the spindle body along the Z axis and movement of the pressure foot relative to the spindle body, respectively. The tool is lowered until its tip breaks the laser beam, tripping the sensor. The pressure foot relative movement is monitored by the high resolution (0.000020) linear scale sensor 56G. The distance the spindle body travels downwardly after the pressure foot contacts the surface 90A until the sensor detector 90D is tripped provides a measurement which can, with the distance of the beam from the surface 90A, be used to calculate the exact relationship of the drill tip to the pressure foot. This in turn permits the system to precisely control each drill stroke to a very precise depth, e.g. within plus/minus 1.5 mils.

Figure 6:
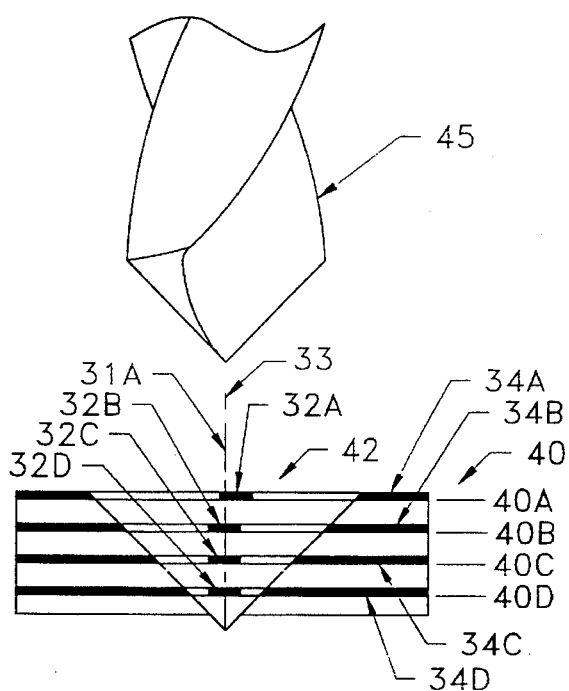
FIG. 6 is a cross-sectional view of a PCB, taken through a conical opening cut therein to expose test patterns in accordance with the invention.

FIG. 6 illustrates a cross-sectional view of a portion of an exemplary PCB 40 in which a cone-shaped opening region 42 has been cut along a core axis 33 to expose edges of the lines of each layer's test pattern. Thus, exemplary PCB 40 in FIG. 6 has four dielectric layers 40A–40D, on which target pattern lines 32A–D and 34A–D have been formed prior to lamination of the layers.

Figure 10:
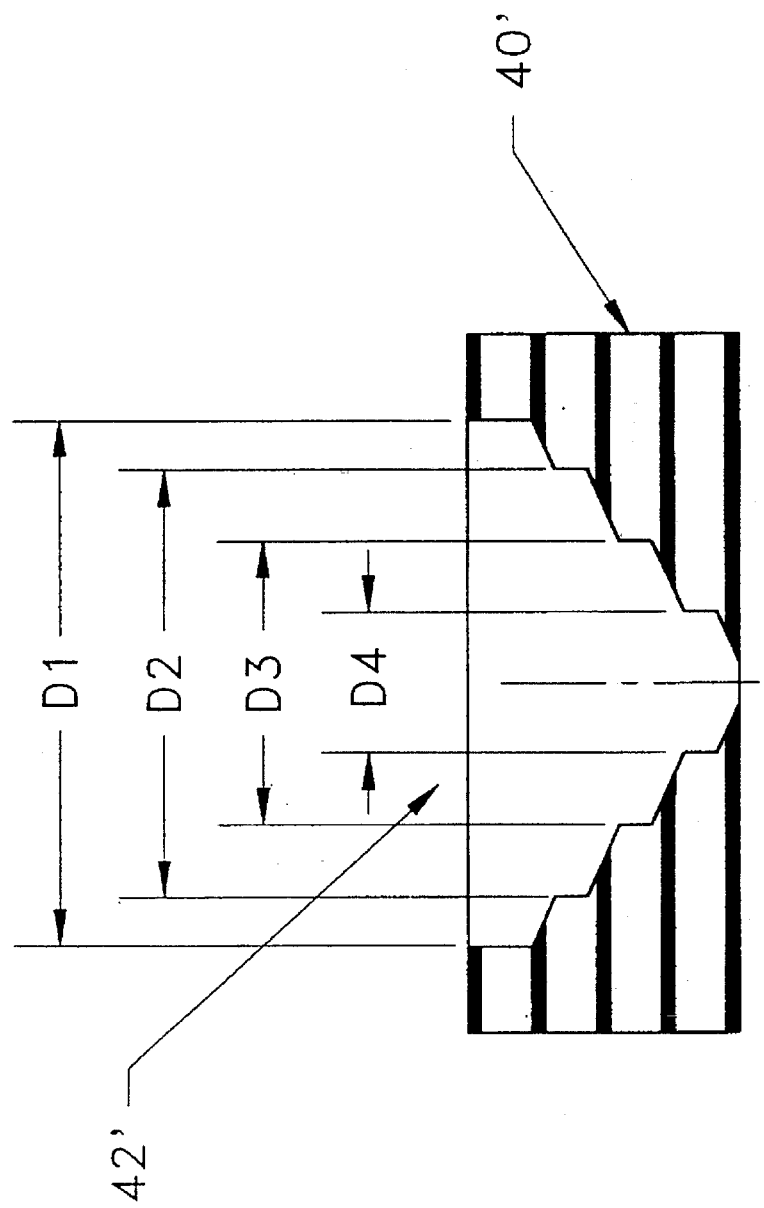
FIG. 10 illustrates an alternate form of test pattern opening formed in the PCB, formed by sequential use of progressively smaller drilling tools.

Instead of a smoothly tapered opening region 42 such as a conical configuration, the opening region 42 can be formed by sequential use of progressively smaller diameter conventional drills, by changing the tool size as each progressive cross layer is exposed, thereby producing an opening having stepped diameters, which are reduced as each successive layer is exposed. This process allows the vision computer to closely monitor the depth of each layer. Moreover, since a larger area of each cross line is exposed at each layer shelf, this type of opening can provide improved vision and resolution in some instances. Such an alternative opening configuration 42' is illustrated in FIG. 10 for a five layer board 40'. Here, a cutting tool having diameter D1 is used to cut a shallow opening to the depth of the test pattern on the second layer, a cutting tool having diameter D2 smaller than D1 is used to cut a slightly deeper hole to the depth of the test pattern on the third layer, and so on, using drills having diameters D3 and D4 of progressively smaller diameter. As the layer count increases, the controller will tailor the hole for the best viewing.

The drilling machine vacuums all debris from the hole 42, and controls the drilling process so that the PCB material does not become molten and smear the optical image. This is accomplished, in the conventional manner, by controlling the drilling tool rotational rate and feed rate to prevent smearing the epoxy, so that the cutting point temperature remains below the melting temperature of epoxy.

Figure 7:
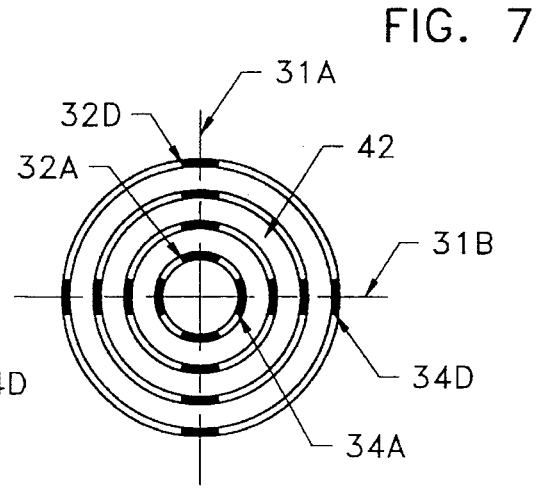

The cone-shaped opening region 42 allows all the exposed portions of the layer pattern crosses to be viewed from a position above the PCB 40. The precision X-Y positioning system is operated to sequentially position each opening 42 directly beneath the lens 64 of the vision system. As each opening is positioned beneath the lens, the vision system is then operated to illuminate the opening with red illumination light, and a single image of the opening region is captured by the vision system. FIG. 7 illustrates an exemplary camera image of an opening 42, with the exposed edges of successive layer test patterns visible; in this example, the test patterns are aligned with the nominal cross axes 31A and 31B, and therefore illustrate the nominal case in which the laminated layers have retained perfect alignment after the lamination process. In such a case, no revision need be made to optimize the drill coordinates.

Figure 8:
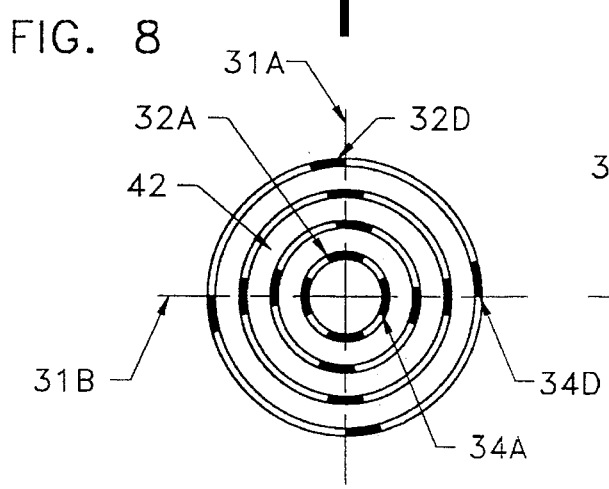
FIGS. 7 and 8 are exemplary camera images taken from above the PCB conical opening of FIG. 6.

FIG. 8 illustrates an exemplary camera image of an opening 42 in an exemplary, typical PCB 40, wherein there has been shifting and/or rotation of the board layers 40A–40D relative to one another during the lamination process. The shifts and rotations of the layers relative to one another are visible in a single image taken by the image system 62 through lens 64.

The image of the opening top view as shown in FIGS. 7 and 8 is digitized and processed by the image processing computer 72 to determine the amounts of shift of the layers 40A–D relative to one another. In effect, the image processing computer determines X and Y offset values for each layer, representing the offset of the actual center of the test pattern from the nominal center of the test pattern.

All compensation data for each target pattern opening is gathered with one image or frame. No mechanical mechanism is required to move in and out or rotate during the information gathering. A high depth-of-field gaging lens 64 virtually eliminates errors resulting from small changes in the line-to-lens distance. Such a gaging lens views all part features straight on, producing undistorted images and permitting a straight view down bores and holes. Identical part features can be gaged the same size over the entire depth-of-field, independent of their distance from the lens. Such lenses are commercially available. Exemplary lenses suitable for the purpose are marketed by Melles Griot Optics, 55 Science Parkway, Rochester, N.Y. 14620, e.g., as the "Invarigon Optical Comparator" lens series, such as base and fixed magnification lenses, model numbers 59 LGA 499 and 59 LFG 410. Such a telecentric lens does not require a zoom lens function, and therefore avoids the errors inherent in zoom lens measuring techniques.

The simplicity of this method allows for long term accuracy without periodic calibrations and adjustments. There is no delicate mechanism, prone to damage and misalignment, which must enter into a confined area to judge the layer alignments.

The computer vision system determines the center of the cross target for each layer by averaging the measured distance of the four exposed cross-sectional segments of the target pattern lines in the same layer, from the nominal center position of the target. Then the center points of each cross target are used to compute a center for the pattern location. This may simply be an average of the center positions for each layer, or a best fit of the centers of each layer to provide a particular test pattern center location. Software can be used to weigh the importance of each layer. In this way, layers with critical clearance will be favored more than less important ones. If all layers have the target cross present, the vision system will determine which layers are which by their position about the lens center point.

After all four corner target areas are examined, and the vision computer has processed the images to provide a set of coordinates for each target area which indicates the actual center of that area, the drilling system controller applies a mathematical algorithm equivalent to "least squares best fit" to determine the compensation values to apply to the drill program. The correction is defined in terms of conventional drilling machine compensation values of X-offset, Y-offset, X-stretch, Y-stretch and rotation. The compensation is only used for the particular PCB analyzed by the system, and must be determined again for each new PCB. The drilling machine must control the sequence of events to ensure offsets for a previous panel are not applied to the target locations of a new panel.

Figure 13:
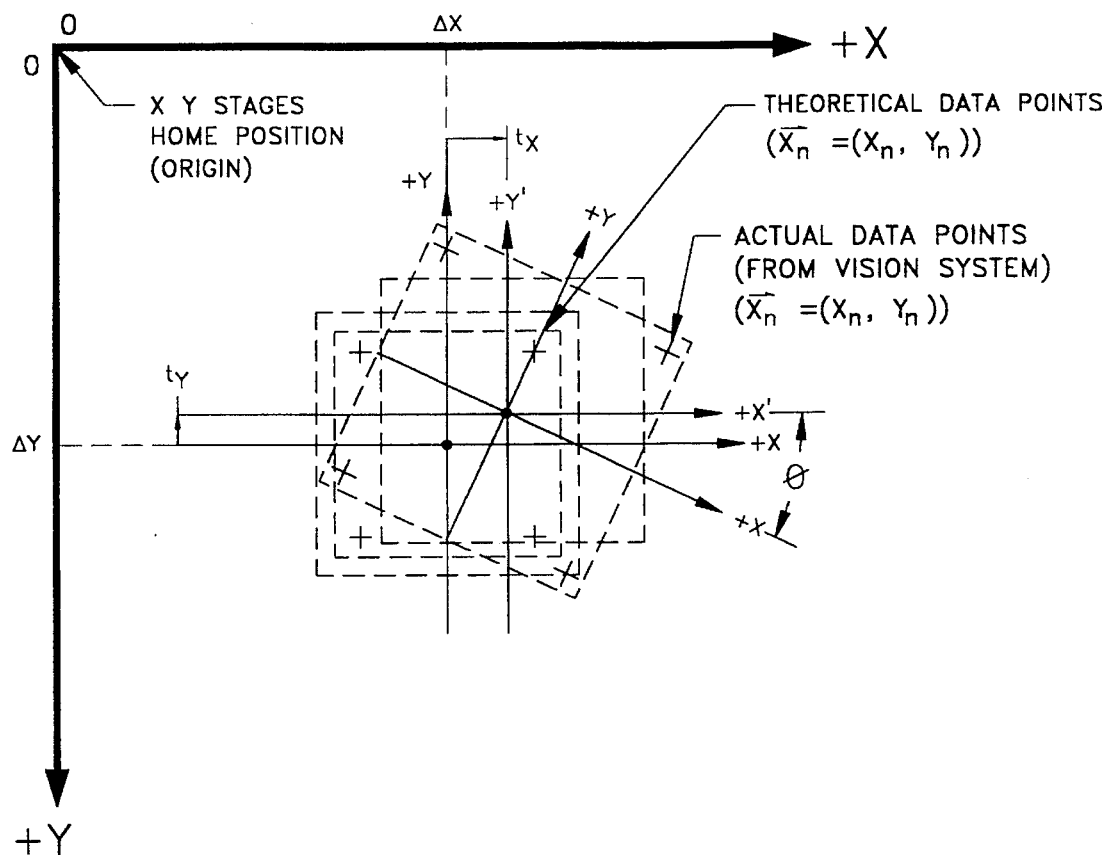
FIG. 13 shows an exemplary coordinate system for compensation calculations in an exemplary least squares, bets fit algorithm.

An exemplary procedure and algorithm employs the following steps to provide the compensated drill coordinates. This procedure employs the coordinate system shown in FIG. 13, where: (X,Y)=coordinates of points relative to the x-y-stage's home coordinate system, (X,Y)=coordinates of points relative to the PCB's theoretical or nominal center coordinate system, $(\overline{X},\overline{Y})$ or $(\overline{X}_n,\overline{Y}_n)$=data points of the theoretical (tooling) board.

1) Input Data:
Read (X,Y) data points from the vision system based on the x-y stage's home coordinate system. $(X_1,Y_1)$=first data point; $(X_2,Y_2)$=second data point; ... $(X_n,Y_n)$=nth data point, where n is an even number.

2) Transform data points into (X,Y) coordinate system, which is located at the center of symmetry of the theoretical board position:

$$x_n = X_n - \Delta X$$

$$y_n = -Y_n + \Delta Y$$

where $\Delta X$ and $\Delta Y$ are tool constants.

3) Determine tool constants:
$(\Delta X, \Delta Y)$=offset to theoretical board center location.
$(\overline{X},\overline{Y})$=coordinates of ideal or tooling board, where n=1, 2, ... N=number of points. $\overline{X}_n = X_n - \Delta X$, and $\overline{Y}_n = -Y_n + \Delta Y$.

4) Compute constants for a set of input data:

| | | | | |
|---|---|---|---|---|
| $A$ | = | $\Sigma(y_n)(\overline{X}_n)$ | $F$ = | $\Sigma(y_n)^2$ |
| $B$ | = | $\Sigma(x_n)(\overline{Y}_n)$ | $G$ = | $\Sigma(\overline{X}_n)^2$ |
| $C$ | = | $\Sigma(x_n)$ | $H$ = | $\Sigma(\overline{Y}_n)^2$ |
| $D$ | = | $\Sigma(y_n)$ | $I$ = | $\Sigma(x_n)(\overline{X}_n)$ |
| $E$ | = | $\Sigma(x_n)^2$ | $J$ = | $\Sigma(y_n)(\overline{Y}_n)$ | where all summations are over n=1 to N.

5) Compute transformation variables:

$$\theta = \arctan((B-A)/(I+J))$$

$$M = [[(B-A)^2 + (I+J)x^2]^{1/2}]/(G+H)$$

$$t_x = [D(B-A) - C(I+J)]/[N[(B-A)^2 + (I+J)^2]^{1/2}]$$

$$t_y = [C(A-B) - D(I+J)]/[N[(B-A)^2 + (I+J)^2]^{1/2}]$$

6) Compute actual drill pattern coordinates based on known/theoretical or ideal coordinates:

$$X_i = M[(\overline{X}_i + t_x - \Delta X)\cos\theta + (-\overline{Y}_i + \Delta Y + t_y)\sin\theta] + \Delta X$$

$$Y_i = M[(\overline{X}_i + t_x - \Delta X)\sin\theta - (-\overline{Y}_i + \Delta Y + t_y)\cos\theta] + \Delta Y$$

or $$x_i = M[(\overline{X}_i + t_x)\cos\theta + (\overline{Y}_i + t_y)\sin\theta]$$

$$y_i = M[(\overline{X}_i + t_x)\sin\theta - (\overline{Y}_i + t_y)\cos\theta]$$

Figure 12:
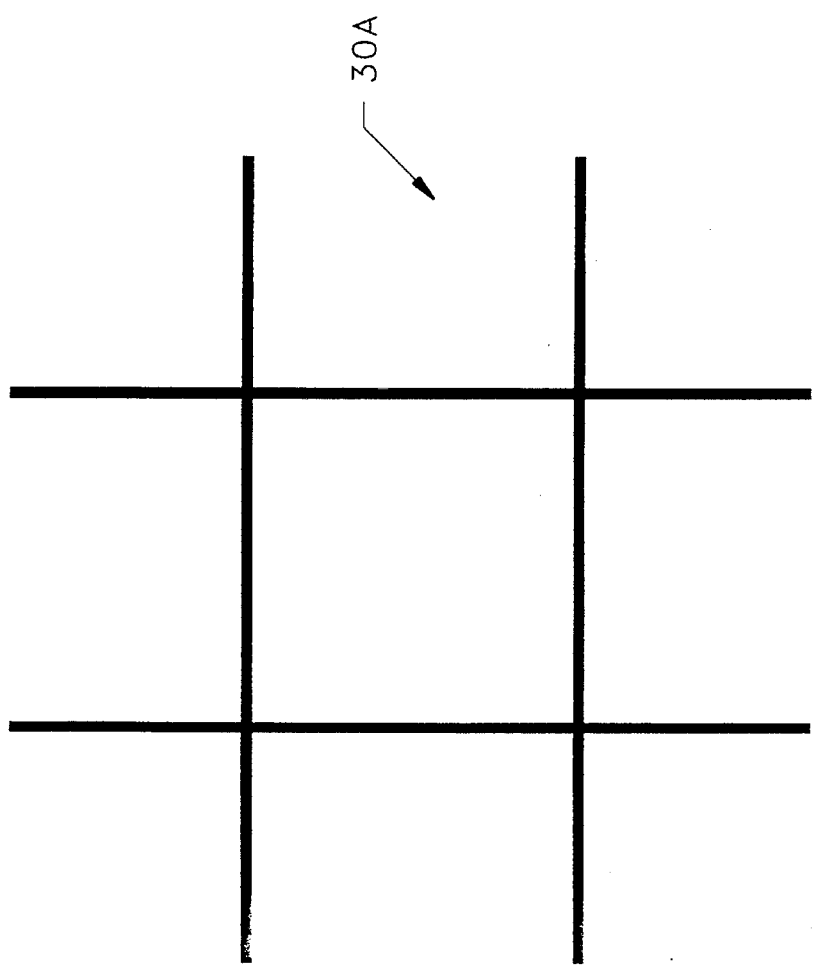
FIG. 12 illustrates a test pattern comprising an array of crosses.

To rework any drill locations on the panel, or to complete a drilling operation after the board has been removed after partial drilling to perform another processing step, the compensation values must be restored. Three techniques are possible. One technique is to use the vision machine to reinspect the already cut cone-shaped inspection holes to determine the correction values. A second technique is to cut another cone-shaped hole at a given offset from the first, and inspect and calculate offsets again. This requires a small array of target crosses, e.g. four to six crosses at each corner, be incorporated in the artwork. One exemplary array 30A is shown in FIG. 12. A third technique is to save the compensation data in a print-out or other format so it can be re-entered when the panel is reworked.

Statistical data can be gathered from a batch of panels to further improve the lamination registration process. The computer provides the layer offset data which can be used as indicators to determine whether changes to the process are improving the layer registration.

Figure 9A:
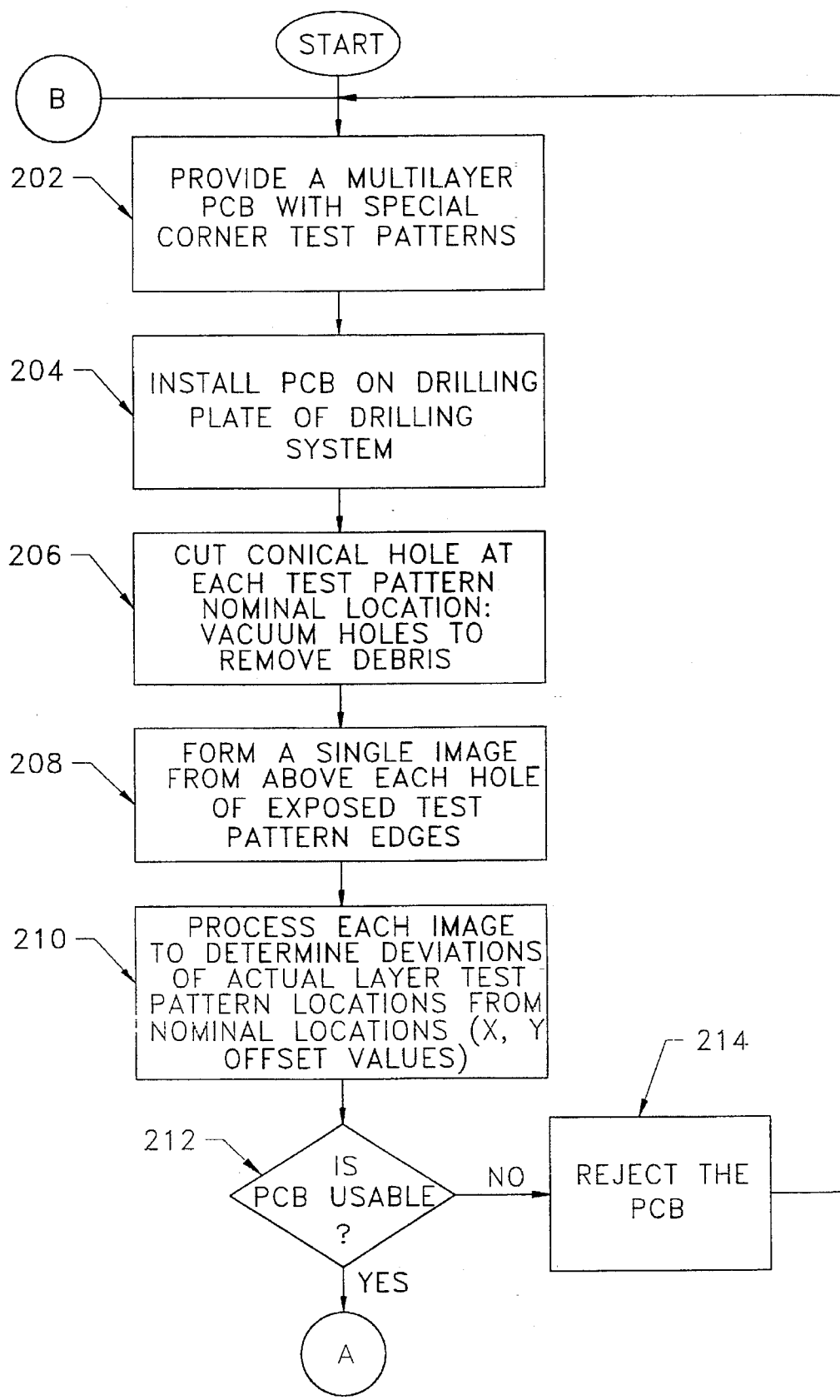
FIGS. 9A and 9B illustrate a flow diagram of the optimization method of this invention.
Figure 9B:
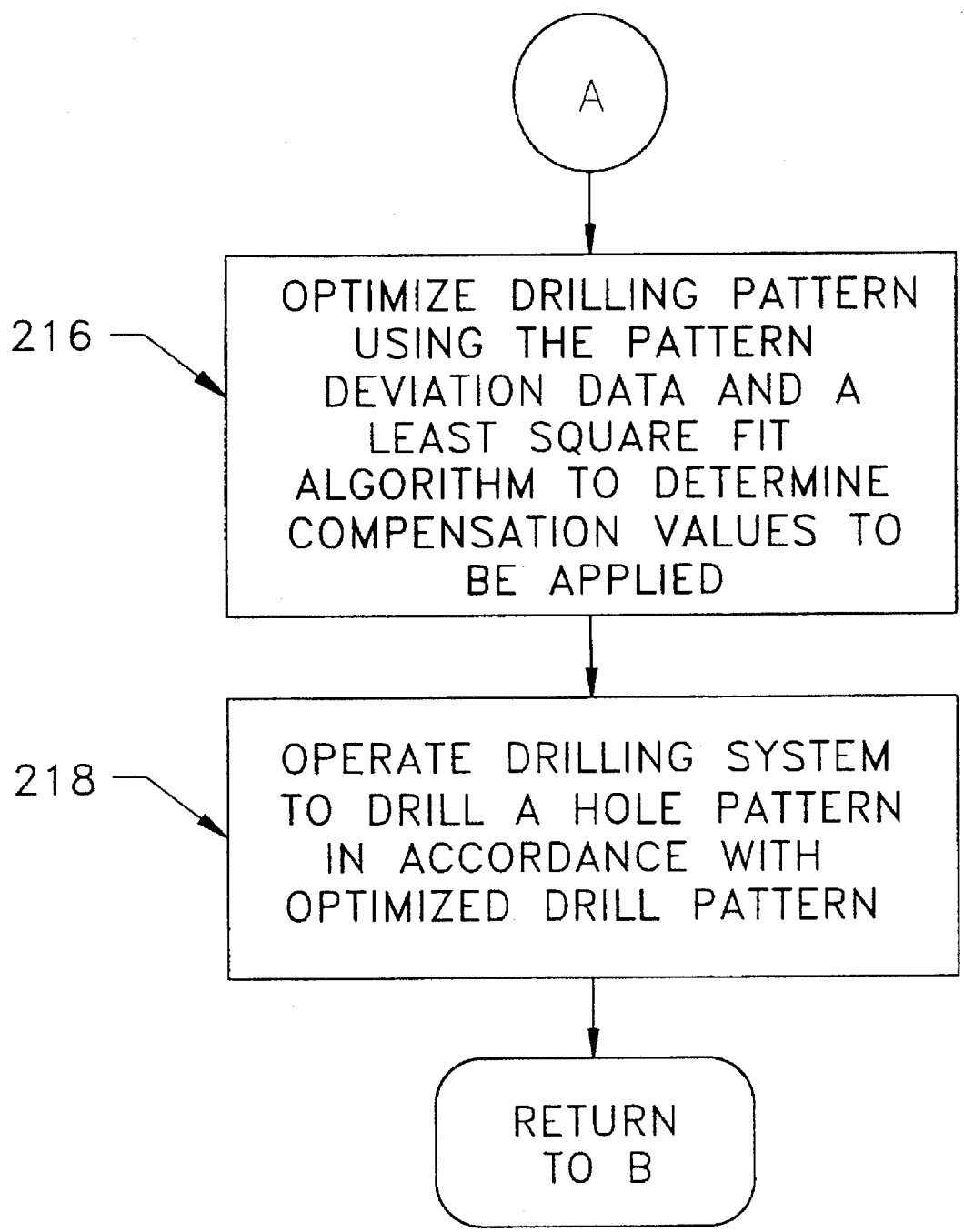

FIGS. 9A–9B illustrate a simplified flow diagram of the preferred embodiment of the optimization method. At step 202, a multilayer PCB with the special test patterns shown in FIG. 3 is provided, and at step 204 installed on the drilling plate of the drilling system. The particular location of the PCB is registered by convention means such as pins which extend from the plate and are received in special openings formed in the PCB. Next, at step 206, conical openings are cut at each test pattern nominal location, and debris from the cutting operation is removed by a vacuum system which is part of the drilling system. Such vacuum systems are well known in the art. During this step, the X-Y positioning system is controlled to move the PCB under the drilling spindle, with the nominal center of the particular test pattern located directly beneath the drilling tool.

At step 208, the X-Y position system of the drilling system operates to position the PCB relative to the horizontal projection of the lens so that a conical region is directly beneath the lens, with its nominal center aligned with the center axis of the lens 64. An image of the conical region is taken, digitized and stored in memory, or immediately processed to provide the X and Y offset values for each layer test pattern.

At step 210 the respective images of the conical openings and the visible parts of the test patterns are processed to determine deviations of actual layer test pattern locations from the nominal locations. Thus, this step includes processing the images to provide, for each test pattern visible in the image, a set of X and Y offset values specifying the offset of the actual measured test pattern center from the nominal test pattern center location. These values can be determined by calculating the offset of the two vertical line segments of the target from the nominal center, averaging this offset to give the X offset value, calculating offsets of the two horizontal line segments, and averaging these offset values to give the Y offset value. A composite X,Y offset data coordinate set for the set of test patterns at the conical opening is then determined. The remaining conical regions are in sequence positioned beneath the lens, imaged and the images are in turn stored in memory, or immediately processed to give the X and Y center offset values for each layer visible in these openings, and then the composite X,Y offset data coordinate set for all the layers visible in the particular image. Vision systems are commercially available which can provide, or be readily adapted to provide, the type of measurements needed from the digitized image. For example, the Image-LC vision system, comprising an image processor, marketed by Matrox Electronix Systems, Ltd., 1055 St. Regis Boulevard, Dorval, Quebec, Canada H9P 2T4, is suitable for the purpose. Such an image processor can be readily programmed to sort and recognize the particular cross-sectional segment shape created by the conical or stepped opening, determine the coordinates of the image shapes found, and correlate the positions to associate four segment locations for each concentric ring for a layer's test pattern.

The X and Y offset data provided regarding each test pattern layer can be used (step 212) to determine whether the PCB layer shifts are sufficiently great that the board cannot be used, i.e., the layers have shifted to such a degree that an acceptable board could not result from the drilling operations. This test is performed, e.g., by comparing the differences in offsets between the layers to a predetermined threshold, indicating whether the layers have shifted in position relative to each other by such a degree that the break-out will exceed the tolerance. If the board is not usable, it is rejected (step 214), and operation branches back to step 202 to commence work on another PCB.

If the PCB is determined to be usable, then at step 216 the drilling pattern is optimized using the pattern deviation data and a least square, best fit algorithm to determine the compensation values to be applied to the nominal locations at which holes are to be drilled. The compensation values are the conventional X-offset, Y-offset, X-stretch/shrink, Y-stretch/shrink and rotation values which are also determined by the conventional X-ray process. This optimization algorithm can be conducted by the controller 70, after receiving the X and Y offset data processed in step 210. The exemplary algorithm process described above can be used. Other algorithms are available, which can calculate a set of compensation values and then compute a set of compensated drill coordinates. Conventional drilling system controllers, e.g. the model 45 controller from Sieb & Meyer, includes an algorithm to calculate a set of compensation values (X-offset, Y-offset, X-stretch/shrink, Y-stretch/shrink, and rotation), given data from the vision system, which are then applied to each set of nominal drill coordinates to compensate the nominal drill coordinates.

The drilling system is then operated at step 218 to drill the hole pattern in accordance with the optimized drill location pattern. Operation then returns to step 202 to process another PCB.

The advantages of using this technique are many. The conventional technique to perform an equivalent function uses an X-ray machine. Drilling test coupon pads and viewing them on an X-ray machine in the conventional manner may need to be repeated several times. This is very time consuming and cannot provide the pre-drilling qualification possible with the cone method and mathematical analysis. Moreover, the X-ray technique does not provide adequate measurement resolution, and a small amount of accuracy (typically 0.0004 inch) is lost in removing and replacing the panel on the tooling plate. As a circuit board panel progresses further through the fabrication process it becomes increasingly more expensive to scrap. This invention improves the fabrication process in several ways. It permits inspection of the product at an early phase of the drilling cycle. Rejecting the panel at the early phase of work, before an operator spends twenty minutes X-raying coupons and several hours drilling 50,000 holes, is far more efficient. The cone target technique is completely automated, removing the operator errors that often plague a complicated process. The accuracy is improved because the vision system can make ¼ pixel (0.8 micron) judgments without the errors caused by removing the panel for X-ray measurements. Thus, benefits of the invention include inspection of all layers of the PCB at the same time, rapid pattern optimization cycle, high resolution accuracy of measurement, performance of optimization and drilling process on the same machine, elimination of tooling error introduced by removing the PCB for X-ray measurements, elimination of a radiation hazard inherent in X-ray measurements, multi-station operation, use of an optical method which does not require a zoom lens with attendant reduction in measurement accuracy, and reduction in capital expense of the measurement system over expensive X-ray systems.

In the foregoing examples, the special test patterns have been formed in each layer of the PCB. It will be understood that some multilayer PCBs may include layers whose relative position is not critical, and wherein it is unnecessary to provide compensation. In this case, the special test patterns need not be formed in such layers.

It is understood that the above-described embodiments are merely illustrative of the possible specific embodiments which may represent principles of the present invention. Other arrangements may readily be devised in accordance with these principles by those skilled in the art without departing from the scope and spirit of the invention.

What is claimed is:

1. A method for optimizing drill coordinates in a laminated multilayer printer circuit board, comprising a sequence of the following steps:

forming one or more test patterns in at least two of said layers prior to lamination of said layers to form said board, said test patterns arranged at one or more predetermined nominal test pattern locations in said layers, so that a test pattern in at least one layer nominally overlays a test pattern in another said layer under nominal board assembly conditions;

forming an opening in an exposed surface of said laminated circuit board at each of said test pattern locations, said openings having a depth sufficient to penetrate each layer having said test patterns formed therein and having a cross-sectional dimension which decreases in size from a dimension at said board surface to a smaller dimension at said depth, thereby exposing portions of said test patterns;

forming from above said surface a single image of each said opening, each said image comprising pixels representing said exposed edges of said test patterns;

processing said images of said openings to determine, from said exposed portions of said test patterns, deviations from nominal positions of said test patterns of said layers; and optimizing drill coordinates to compensate for said deviations.

2. The method of claim 1 wherein said opening is tapered and formed by a conical cutting tool.

3. The method of claim 2 wherein said cutting tool includes a cutting tool end defining an included angle of about one hundred degrees.

4. The method of claim 1 wherein said opening has a stepped cross-sectional configuration defined by a plurality of discrete layer cross-sectional layer dimensions which progressively decrease from a top layer to a layer at an extreme depth of said opening.

5. The method of claim 4 wherein said opening is formed by use of a plurality of drilling tools, wherein a first tool having a first diameter is used to cut an opening in an uppermost layer to be exposed, a second tool having a second diameter smaller than said first tool diameter is used to cut an opening in a second layer below said uppermost layer, and tools of progressively smaller diameter are used to cut openings in any layers below said second layer.

6. The method of claim 1 wherein said test patterns comprises first and second orthogonal conductor lines, and said exposed portions of each test pattern are nominally disposed at a 90 degree spacing about a perimeter of said opening.

7. The method of claim 1 wherein said test patterns each comprise an array of adjacent test patterns defined in said layers, permitting said optimizing to be repeated for a particular board.

8. The method of claim 1 wherein said image is formed through a telecentric lens and without the use of a zoom lens.

9. The method of claim 1 further comprising the step of drilling holes in said printed circuit board in accordance with said optimized drill coordinates.

10. The method of claim 1 further comprising the step of determining from said deviation data whether said board is usable, and rejecting said board if it is not usable.

11. The method of claim 1 wherein said printed circuit board has a rectilinear configuration having four corners, and said test patterns are located in each of said corners.

12. An automated drilling system for drilling a hole pattern in a multilayer laminated circuit board at optimized drill coordinates, the board having formed thereon one or more spaced test patterns in at least two of the layers prior to lamination of the layers, arranged at one or more predetermined nominal test pattern locations in the layers, so that a test pattern in at least one layer nominally overlays a test pattern in another layer under nominal board assembly conditions, comprising;

means for forming an opening in an exposed surface of said laminated circuit board at each of said test pattern locations, said openings having a depth sufficient to penetrate each layer having said test patterns formed therein and having a cross-sectional dimension which decreases in size from a dimension at said board surface to a smaller dimension at said depth, thereby exposing portions of said test patterns;

image forming means for forming from above said surface a single image of each said opening, each said image comprising pixels representing said exposed portions of said test patterns;

processing means for processing said images of said openings to determine, from said exposed portions of said test patterns, deviations from nominal positions of said test patterns of said layers; and optimizing means for optimizing a set of drill coordinates to compensate for said deviations.

13. The system of claim 12 wherein said means for forming an opening comprises a counter-sink tool.

14. The system of claim 13 wherein said tool includes a cutting tip defining an included angle of substantially one hundred degrees.

15. The system of claim 12 wherein said opening has a stepped cross-sectional configuration defined by a plurality of discrete layer cross-sectional layer dimensions which progressively decrease from a top layer to a layer at an extreme depth of said opening.

16. The system of claim 12 wherein said test patterns comprises first and second orthogonal conductor lines, and said exposed portions of each test pattern are nominally disposed at a 90 degree spacing about a perimeter of said opening, said opening exposes portions of said patterns disposed at nominal concentric circles, and said processing means comprises means for detecting shifts in positions of said layers in dependence on measurements of positions of said portions represented in said images.

17. The system of claim 12 wherein said image forming means comprises a telecentric lens spaced away from said board surface for focusing light onto an image plane, and an image retaining means disposed at said image plane for capturing said image for processing.

18. The system of claim 12 further comprising drilling means for drilling holes in said printed circuit board in accordance with said optimized drill coordinates.

19. The system of claim 12 further wherein said processing means further comprises means for determining from said deviation data whether said board is usable, and means for rejecting said board if it is not usable.

20. An automated drilling system, comprising:

a work table having means for registering a mounted position of a workpiece;

a drilling spindle having a spindle axis mounted orthogonally to said work table;

optical image means for capturing digitized optical images of an area of said workpiece mounted on said work table, from an image position generally orthogonal to said work table and spaced from a surface of said workpiece mounted at said registered position;

precision positioning means for effecting relative movement between said work table and said spindle and between said work table and said image position in a plane orthogonal to a spindle axis;

means for providing a nominal drill pattern program specifying nominal drill size and coordinates of a drill pattern to be drilled into said board;

drill coordinate optimization means for compensating said nominal drill coordinates for inter-layer shifts of layers comprising said board from nominal positions, said means comprising means for cutting an opening into said board at said nominal test pattern locations, said opening having an opening depth and cross-sectional dimension which decreases from said board surface to said depth so as to expose portions of said test patterns in said various layers to view from above said surface, means for operating said positioning system for each test pattern location to position said opening relative to said image position so that an optical image of said opening is visible from said location, means for operating said image means to capture said image of said opening and said visible portions of said test patterns, processing means for processing said images to determine deviations from nominal layer locations of said respective layers and to calculate compensation values, and means for modifying said nominal hole coordinates by said compensation values; and system control means for operating said positioning means and said drilling spindle to drill said board in accordance with compensated hole coordinates.

21. The system of claim 20 wherein said optical imaging means comprises a telecentric lens having a sufficient depth of field to image said respective test pattern portions at said layers visible in said opening onto said image location.

22. The system of claim 20 further comprising optical illumination means for illuminating said opening while said image is being captured.

23. The system of claim 22 wherein said illumination means comprises red light generating means for illuminating said opening with red light.

24. The system of claim 20 wherein said opening cutting means comprises a counter sink tool operated by said spindle.

25. The system of claim 24 wherein said cutting tool includes a cutting tip defining an included angle of substantially one hundred degrees.

26. The system of claim 20 wherein said test patterns comprises first and second orthogonal conductor lines, and said exposed edges of each test pattern are nominally disposed at a 90 degree spacing about a perimeter of said opening, said opening exposes edges of said patterns disposed at nominal concentric circles, and said processing means comprises means for detecting shifts in positions of said layers in dependence on measurements of positions of said edges represented in said images.

27. The system of claim 20 further wherein said processing means further comprises means for determining from said deviation data whether said board is usable, and means for rejecting said board if it is not usable.

28. A method for measuring lamination drift in a laminated multilayer printer circuit board, comprising a sequence of the following steps:

forming one or more spaced test patterns in at least two of said layers prior to lamination of said layers to form said board, said test patterns arranged at one or more predetermined nominal test pattern locations in said layers, so that a test pattern in at least one layer nominally overlays a test pattern in another said layer under nominal board assembly conditions;

forming an opening in an exposed surface of said laminated circuit board at each of said test pattern locations, said openings having a depth sufficient to penetrate each layer having said test patterns formed therein and having a cross-sectional dimension which decreases in size from a dimension at said board surface to a smaller dimension at said depth, thereby exposing portions of said test patterns;

forming from above said surface a single image of each said opening, each said image comprising pixels representing said exposed portions of said test patterns; and processing said images of said openings to determine, from said exposed portions of said test patterns, deviations from nominal positions of said test patterns of said layers.

29. The method of claim 28 wherein said opening is tapered and formed by a counter sink tool.

30. The method of claim 29 wherein said tool includes a cutting tool end defining an included angle of about one hundred degrees.

31. The method of claim 28 wherein said opening has a stepped cross-sectional configuration defined by a plurality of discrete layer cross-sectional layer dimensions which progressively decrease from a top layer to a layer at an extreme depth of said opening.

32. The method of claim 31 wherein said opening is formed by use of a plurality of drilling tools, wherein a first tool having a first diameter is used to cut an opening in an uppermost layer to be exposed, a second tool having a second diameter smaller than said first tool diameter is used to cut an opening in a second layer below said uppermost layer, and tools of progressively smaller diameter are used to cut openings in any layers below said second layer.

33. The method of claim 28 wherein said test patterns comprises first and second orthogonal conductor lines, and said exposed portions of each test pattern are nominally disposed at a 90 degree spacing about a perimeter of said opening.

34. The method of claim 28 wherein said image is formed through a telecentric lens and without the use of a zoom lens.

35. The method of claim 28 wherein said printed circuit board has a rectilinear configuration having four corners, and said test patterns are located in each of said corners.

* * * * *